(12) United States Patent
Shaw et al.

(10) Patent No.: US 8,299,373 B2
(45) Date of Patent: Oct. 30, 2012

(54) DISPLAY MODULE

(76) Inventors: Derek R. Shaw, Hopkins, MN (US);
John C. Holman, Ham Lake, MN (US);
Christopher M. Lange, New Brighton, MN (US); Nicholas D. Long, Massillon, OH (US); Greg T. Mrozek, Brooklyn Park, MN (US); Michael L. Kashmark, Chisago City, MN (US)

(*) Notice: Subject to any disclaimer, the term of this patent is extended or adjusted under 35 U.S.C. 154(b) by 317 days.

(21) Appl. No.: 12/602,536

(22) PCT Filed: Jun. 12, 2008

(86) PCT No.: PCT/US2008/066639
§ 371 (c)(1),
(2), (4) Date: Apr. 14, 2010

(87) PCT Pub. No.: WO2008/157200
PCT Pub. Date: Dec. 24, 2008

(65) Prior Publication Data
US 2012/0140382 A1    Jun. 7, 2012

Related U.S. Application Data

(60) Provisional application No. 60/944,977, filed on Jun. 19, 2007.

(51) Int. Cl.
*H05K 7/14* (2006.01)
*H05K 7/00* (2006.01)
*G06F 3/02* (2006.01)

(52) U.S. Cl. .............. 174/535; 361/679.17; 361/679.01; 345/156; 345/168

(58) Field of Classification Search .................. 345/156, 345/168, 169; 361/679.17
See application file for complete search history.

(56) References Cited

U.S. PATENT DOCUMENTS

| | | | |
|---|---|---|---|
| 4,815,011 A | 3/1989 | Mizuno et al. | |
| 5,175,873 A * | 12/1992 | Goldenberg et al. | ......... 455/351 |
| 5,699,221 A | 12/1997 | O'Leary et al. | |
| 5,700,976 A | 12/1997 | Hahn et al. | |
| 5,913,439 A | 6/1999 | Von Arx | |
| 6,370,037 B1 | 4/2002 | Schoenfish | |
| 6,504,731 B2 * | 1/2003 | Okamoto | ....................... 361/826 |
| 6,697,681 B1 | 2/2004 | Stoddard et al. | |
| 6,796,173 B1 | 9/2004 | Lajoie et al. | |
| 7,027,310 B2 | 4/2006 | Schneider | |
| 7,036,386 B2 | 5/2006 | Mathiowetz et al. | |
| 2004/0186935 A1 | 9/2004 | Bell et al. | |
| 2006/0170839 A1 | 8/2006 | Yamamoto et al. | |
| 2007/0000849 A1 | 1/2007 | Lutz et al. | |

* cited by examiner

*Primary Examiner* — Zachary M Pape
(74) *Attorney, Agent, or Firm* — Douglas B. Farrow

(57) ABSTRACT

The outer case of the display module 10 is constructed of static dissipative polypropylene components that house a circuit board 16 and display 14. When the display module 10 utilizes the hand held pendant option a front cover 18 is used. This front cover 18 provides a viewing window 20 to the display 14 and a flat surface to attach the membrane 22. When the display module 10 is to be mounted inside of an enclosure, the front cover is replaced by a flat plate 28 that then provides the viewing window 30 and flat surface membrane 32 requirements. The rear portion 12 of the display module 10 is used with either option and contains the necessary features to allow for either the front cover 18 or the flat plate 28 to be attached.

1 Claim, 6 Drawing Sheets

DISPLAY MODULE

TECHNICAL FIELD

This application claims the benefit of U.S. Application Ser. No. 60/944,977, filed Jun. 19, 2007, the contents of which are hereby incorporated by reference.

DISCLOSURE OF THE INVENTION

It is an object of this invention to create a pendant that incorporates a human-machine interface (HMI) and can be hand held or mounted into an enclosure.

The outer case of the display pendant is constructed of static dissipative polypropylene components that house a circuit board and display. When the display pendant utilizes the hand held option a front cover is used. This front cover provides a viewing window to the display and a flat surface to attach the membrane. This membrane is needed as part of the human-machine interface (HMI). When the display pendant is to be mounted inside of an enclosure, the front cover is replaced by a flat plate that then provides the viewing window and flat surface membrane requirements. This assembly is then mounted into an enclosure.

The rear portion of the display pendant is used with either option and contains the necessary features to allow for either the front cover or the flat plate to be attached. This leads to reduced parts, costs, and lends itself to the ease of assembly.

These and other objects and advantages of the invention will appear more fully from the following description made in conjunction with the accompanying drawings wherein like reference characters refer to the same or similar parts throughout the several views.

BEST MODE FOR CARRYING OUT THE INVENTION

Figure 1:
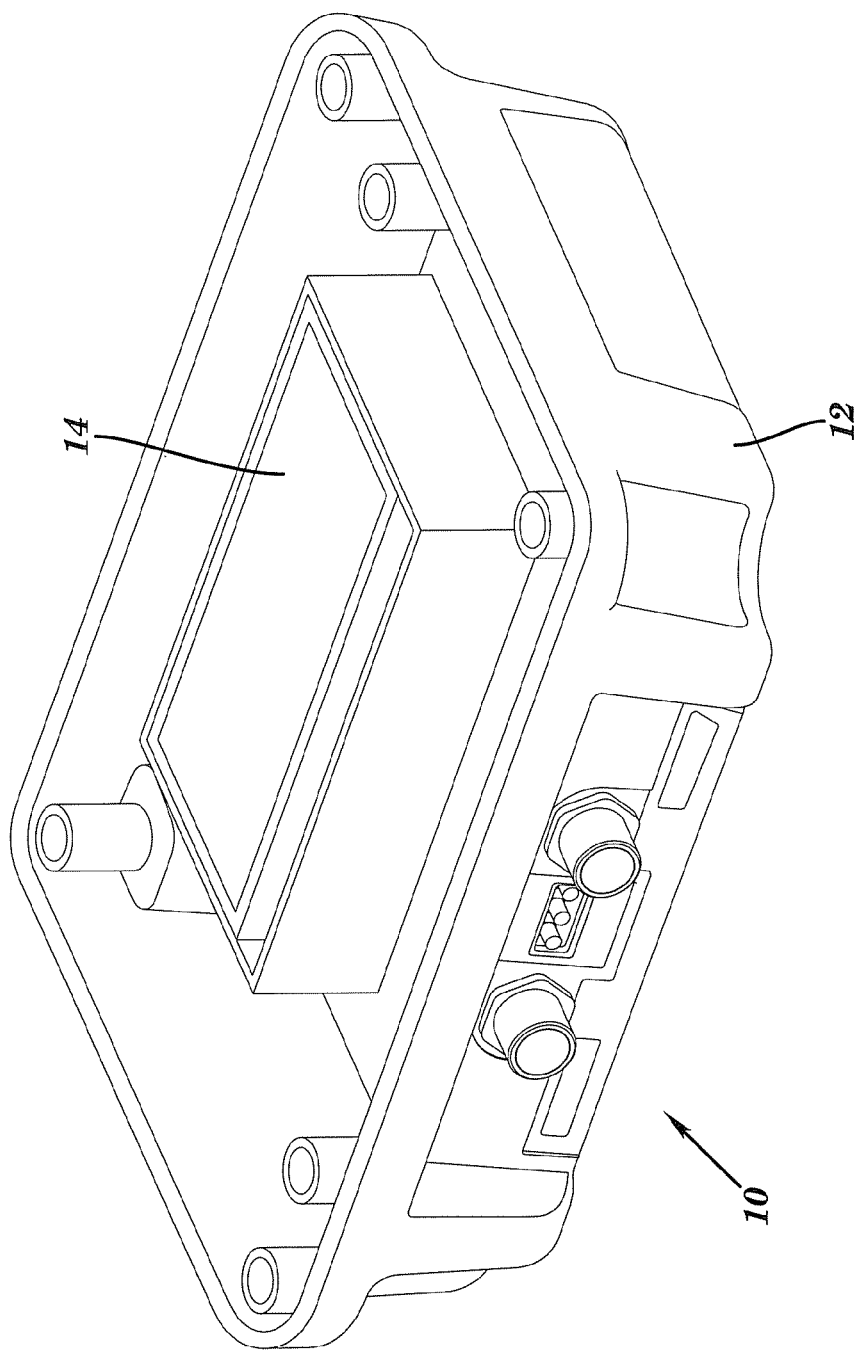
FIG. 1 shows a perspective view of the rear section of the display module of the instant invention.
Figure 2:
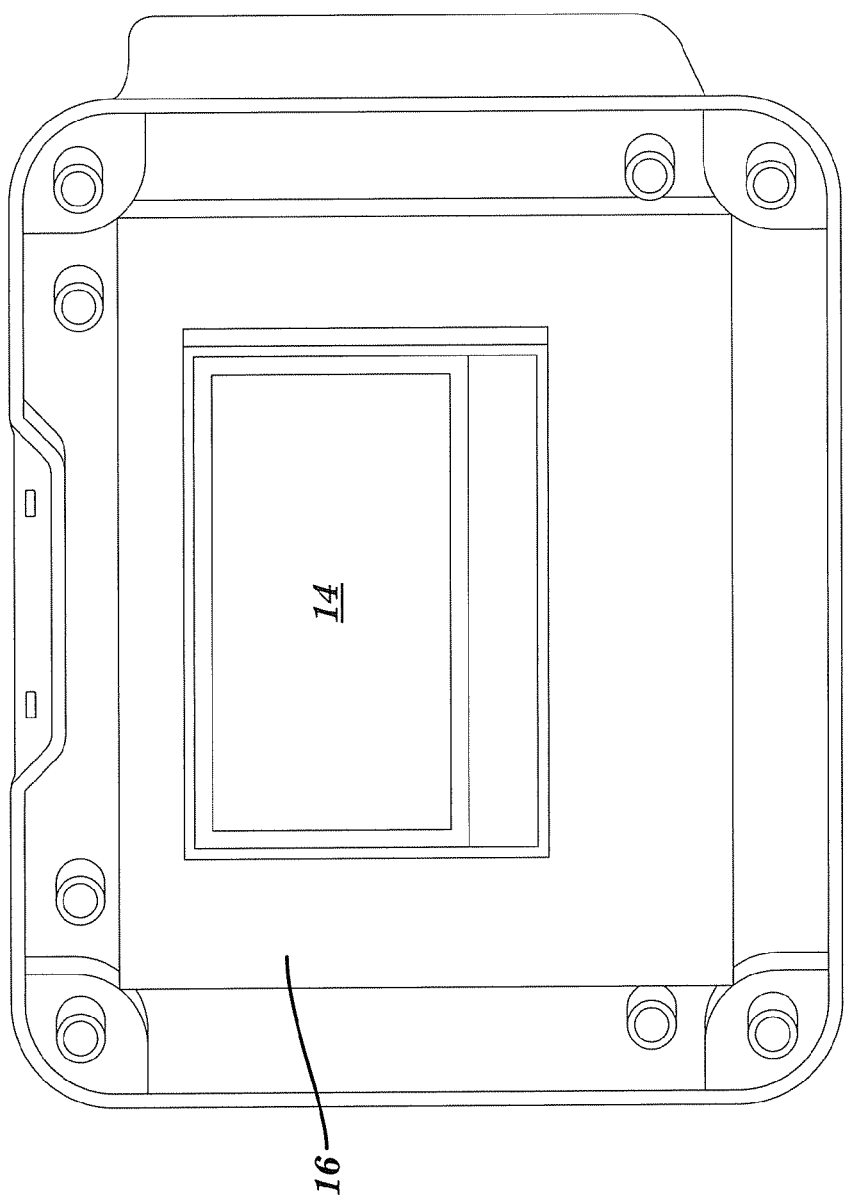
FIG. 2 shows a front perspective view of the rear section of the display module of the instant invention.
Figure 3:
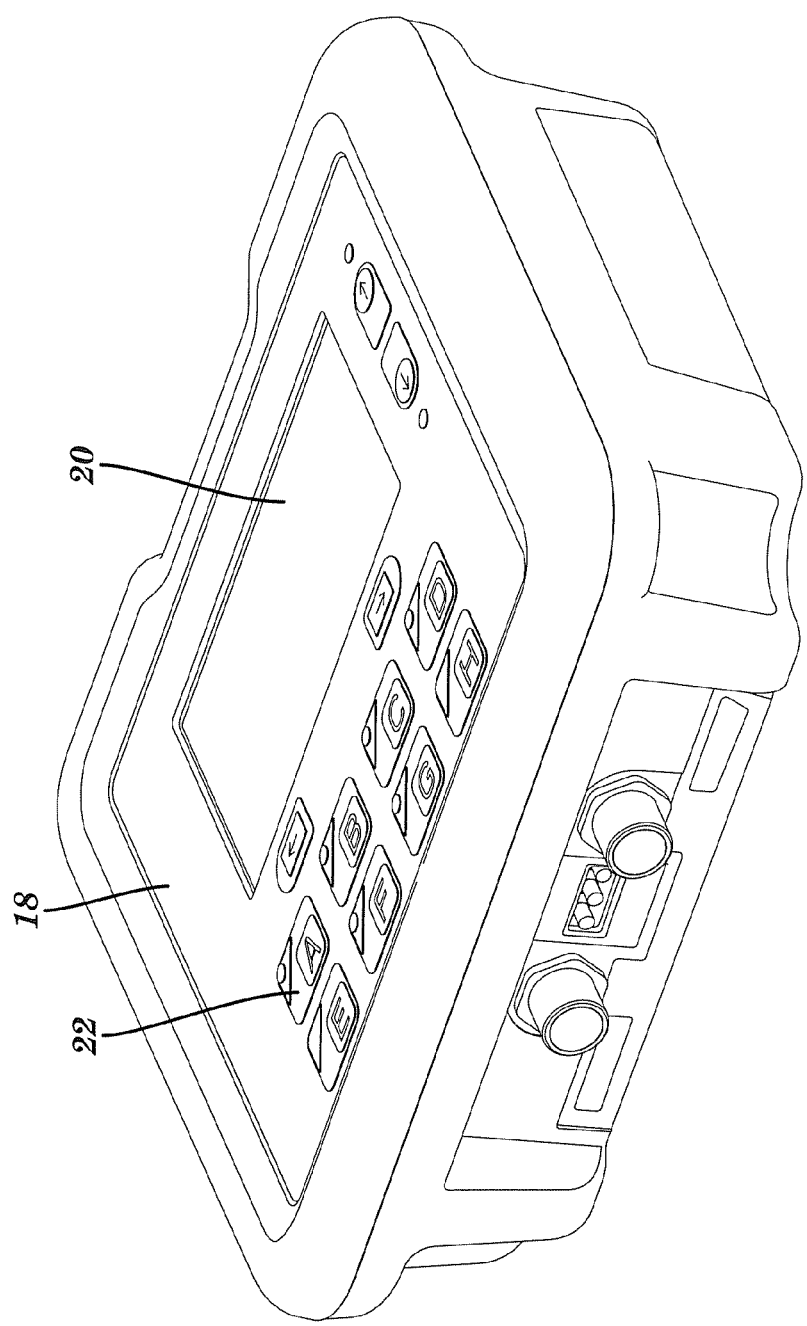
FIG. 3 shows a perspective view of the pendant version of the display module of the instant invention.
Figure 4:
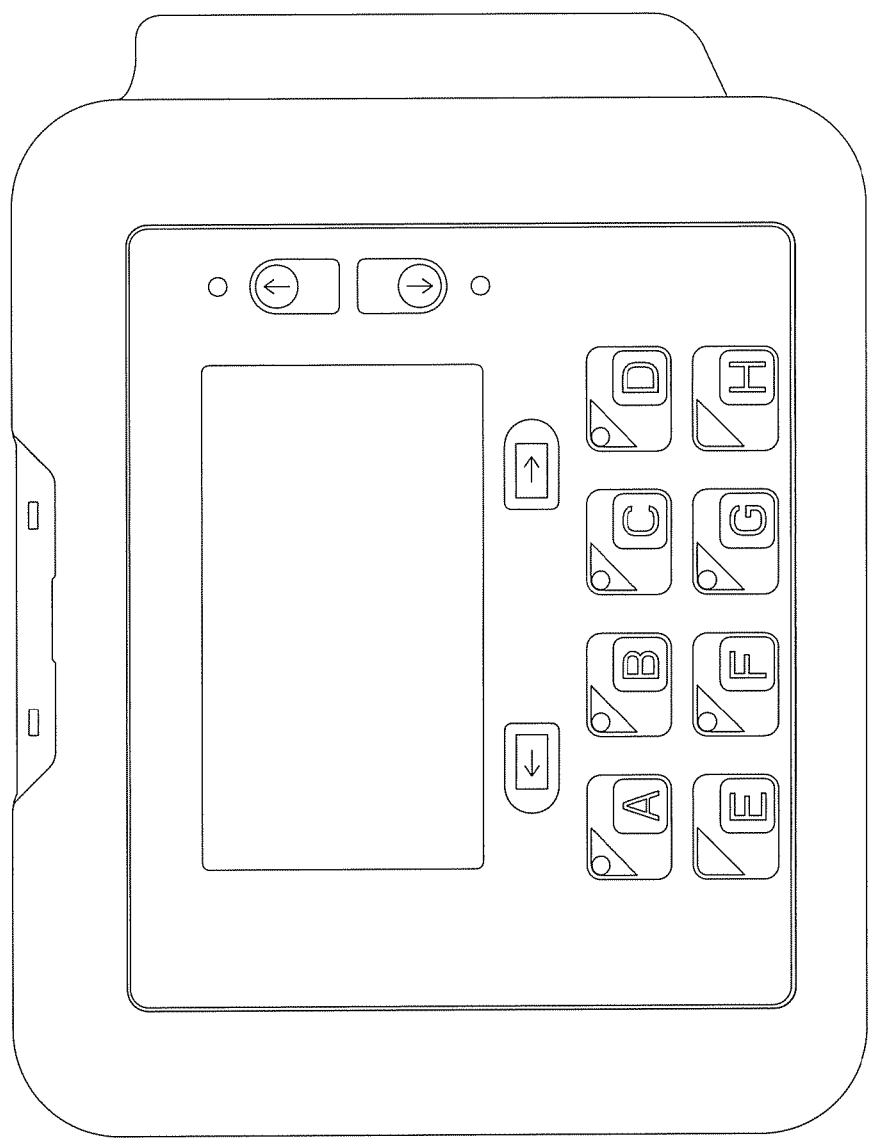
FIG. 4 shows a front perspective view of the pendant version of the display module of the instant invention.
Figure 5:
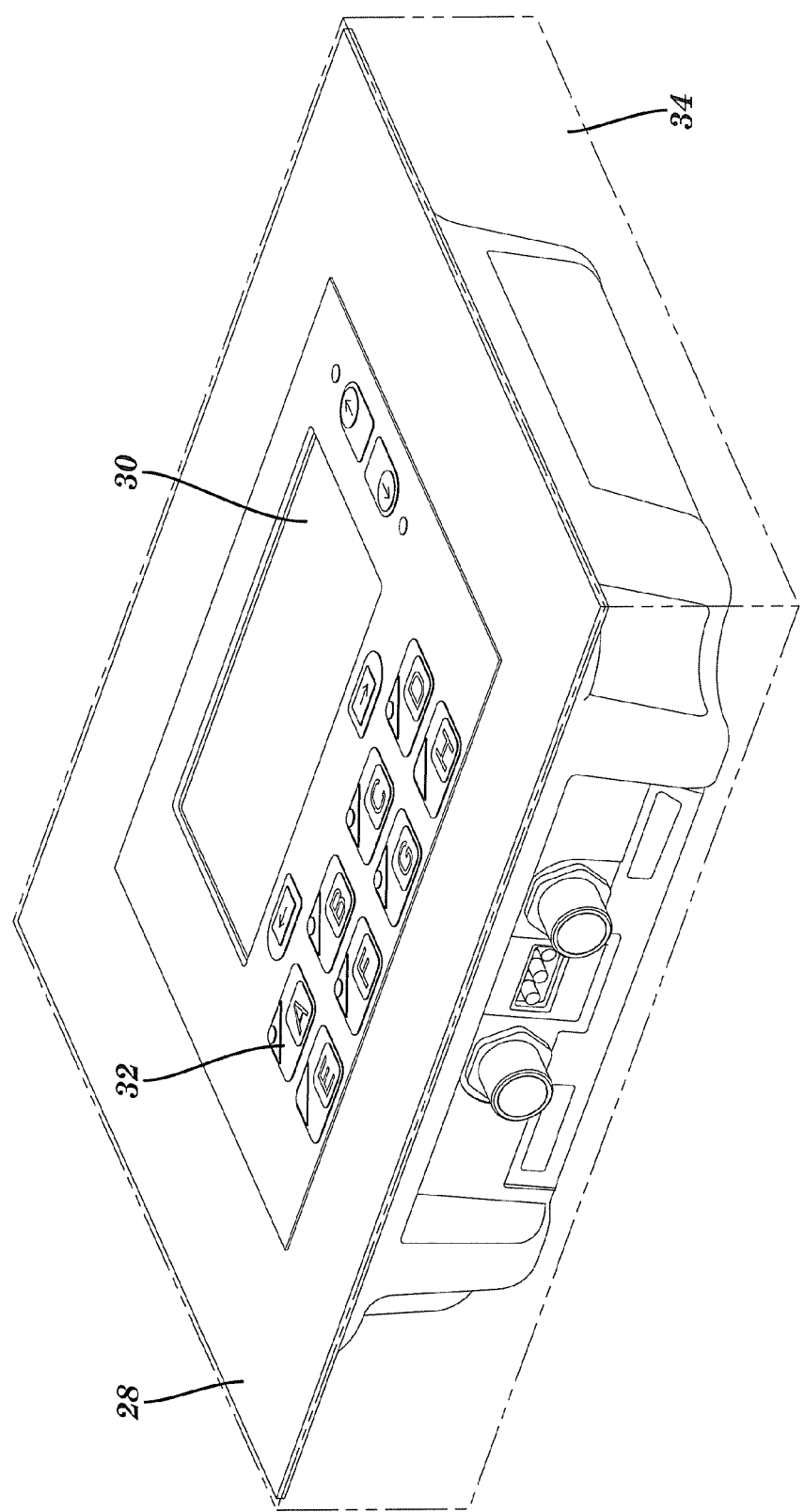
FIG. 5 shows a perspective view of the enclosure-mounted version of the display module of the instant invention.
Figure 6:
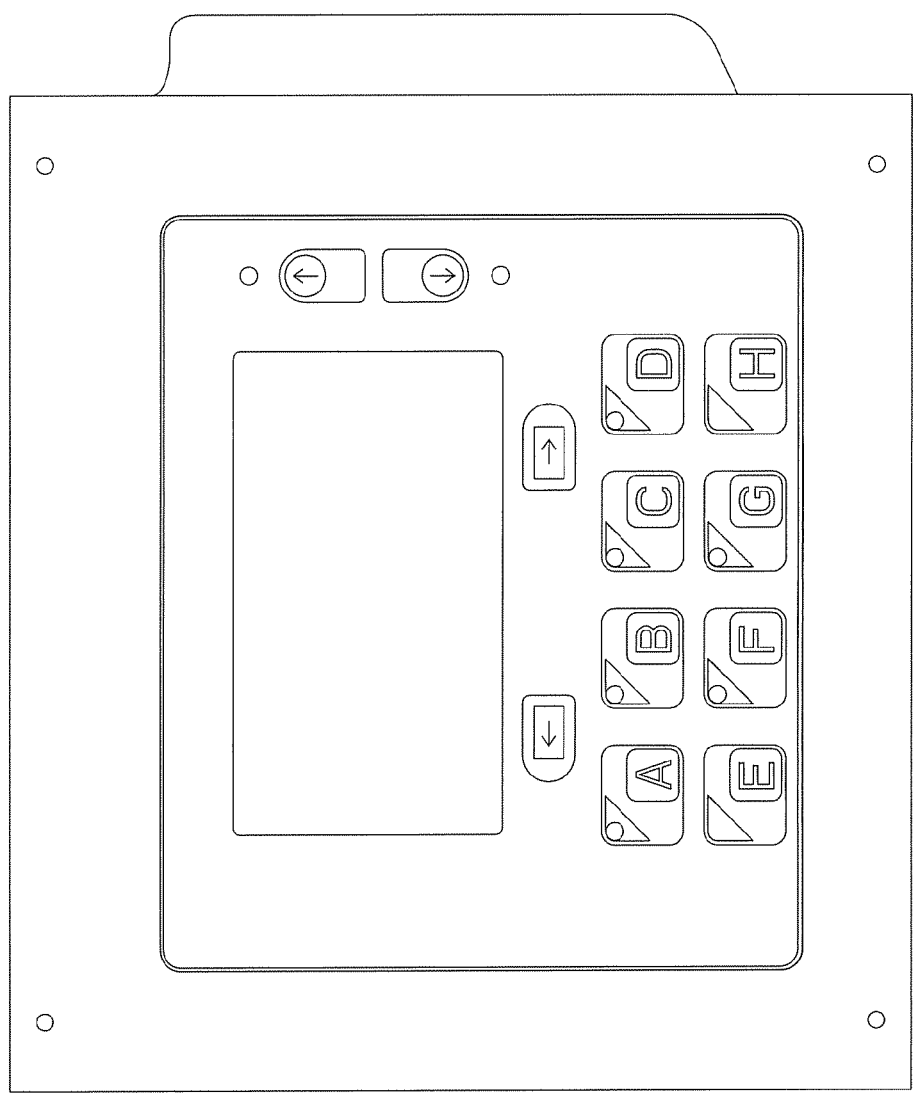
FIG. 6 shows a front perspective view of the enclosure-mounted version of the display module of the instant invention.

The outer case of the display module 10 is constructed of static dissipative polypropylene components that house a circuit board 16 and display 14. When the display module 10 utilizes the hand held pendant option a front cover 18 is used. This front cover 18 provides a viewing window 20 to the display 14 and a flat surface to attach the input membrane 22. This membrane 22 is needed as part of the human-machine interface (HMI). When the display module 10 is to be mounted inside of an enclosure, the front cover is replaced by a flat plate 28 that then provides the viewing window 30 and flat surface membrane 32 requirements. This assembly is then mounted into an enclosure 34.

The rear portion 12 of the display module 10 is used with either option and contains the necessary features to allow for either the front cover 18 or the flat plate 28 to be attached. This leads to reduced parts, costs, and lends itself to the ease of assembly.

It is contemplated that various changes and modifications may be made to the display module without departing from the spirit and scope of the invention as defined by the following claims.

The invention claimed is:

1. A display module for use in controlling multiple component systems, said display module comprising:
   a rear case comprising a display and related circuitry;
   an input membrane;
   a flat plate for affixation to said rear case and to mount said module in an enclosure, said plate comprising an opening for viewing said display;
   a front cover for affixation to said rear case so as to operate said module as a hand-held pendant, said cover comprising an opening for viewing said display; and
   wherein the rear case is attachable to the flat plate and is also attachable to the front cover, so that the front cover can be replaced by the flat plate in use.

\* \* \* \* \*